United States Patent [19]
Prall et al.

[11] Patent Number: 5,866,453
[45] Date of Patent: Feb. 2, 1999

[54] ETCH PROCESS FOR ALIGNING A CAPACITOR STRUCTURE AND AN ADJACENT CONTACT CORRIDOR

[75] Inventors: Kirk D. Prall; Pierre Fazan; Trung Doan; Tyler Lowrey, all of Boise, Id.

[73] Assignee: Micron Technology, Inc., Boise, Id.

[21] Appl. No.: 527,924

[22] Filed: Sep. 14, 1995

[51] Int. Cl.⁶ ........................ H01L 21/8242; H01L 21/20
[52] U.S. Cl. ............................ 438/253; 438/396
[58] Field of Search ................. 437/47, 60, 228, 437/228 CON, 919, 984; 438/253, 254, 396, 397; 257/306

[56] References Cited

U.S. PATENT DOCUMENTS

| | | | |
|---|---|---|---|
| 5,219,793 | 6/1993 | Cooper et al. | 437/195 |
| 5,275,972 | 1/1994 | Ogawa et al. | 437/195 |
| 5,292,677 | 3/1994 | Dennison | 437/52 |
| 5,338,700 | 8/1994 | Dennison et al. | 437/60 |
| 5,362,666 | 11/1994 | Dennison | 437/52 |
| 5,401,681 | 3/1995 | Dennison | 437/60 |
| 5,488,011 | 1/1996 | Figura et al. | 437/60 |
| 5,498,562 | 3/1996 | Dennison et al. | 437/52 |
| 5,563,089 | 10/1996 | Jost et al. | 437/60 |
| 5,605,857 | 2/1997 | Jost et al. | 437/60 |
| 5,650,349 | 7/1997 | Prall et al. | 437/52 |
| 5,656,532 | 8/1997 | Tseng | 438/253 |
| 5,705,438 | 1/1998 | Tseng | 438/253 |

*Primary Examiner*—Charles Bowers
*Assistant Examiner*—Toniae M. Thomas
*Attorney, Agent, or Firm*—Ormiston Korfanta & Holland, PLLC

[57] ABSTRACT

An etch process for increasing the alignment tolerances between capacitor components and an adjacent contact corridor in Dynamic Random Access Memories. The etch process is implemented in a capacitor structure formed over a semiconductor substrate. The capacitor structure includes a first conductor, a dielectric layer on the first conductor and a second conductor on the dielectric layer. The second conductor has a horizontal region laterally adjacent to and extending away from the first conductor. The etch process comprises the steps of: (a) forming a layer of patterned photoresist over the second conductor, the photoresist being patterned to expose a portion of the horizontal region of the second conductor at a desired location of a contact corridor above a source/drain region in the substrate; (b) using the photoresist as an etch mask, anisotropically etching away the exposed portions of the horizontal region of the second conductor; and (c) using the photoresist again as an etch mask, isotropically etching away substantially all of the remaining portions of the horizontal region of the second conductor and thereby enlarging the area available for locating the contact corridor. Alternatively, the horizontal region of the second conductor is removed using a single isotropic etch.

17 Claims, 13 Drawing Sheets

ETCH PROCESS FOR ALIGNING A CAPACITOR STRUCTURE AND AN ADJACENT CONTACT CORRIDOR

CROSS REFERENCE TO RELATED APPLICATIONS

This application is related to the commonly assigned, copending application Ser. No. 08/336,426, by Figura et al. filed on Nov. 11, 1994, titled METHOD OF MAKING A SELF-ALIGNED BIT LINE CONTACT FOR STACKED CAPACITOR DYNAMIC RANDOM ACCESS MEMORY DEVICES.

FIELD OF THE INVENTION

The invention relates generally to the formation of integrated circuit devices and more particularly to an etch process for aligning a capacitor structure and an adjacent contact corridor.

BACKGROUND OF THE INVENTION

Generally, integrated circuits are mass produced by forming many identical circuit patterns on a single silicon wafer. Integrated circuits, also commonly referred to as semiconductor devices, are made by stacking various materials over a silicon substrate. These materials may be electrically conductive, electrically nonconductive (insulators) or electrically semiconductive. Silicon, in single crystal or polycrystalline form, is the most commonly used semiconductor material. Both forms of silicon can be made electrically conductive by adding impurities, commonly referred to as doping. Dynamic Random Access Memories (DRAMs) are integrated circuit devices comprising arrays of memory cells which contain two basic components—a field effect access transistor and a capacitor. Typically, one side of the transistor is connected to one side of the capacitor. The other side of the transistor and the transistor gate electrode are connected to external connection lines called a bit line and a word line, respectively. The other side of the capacitor is connected to a reference voltage. Therefore, the formation of the DRAM memory cell comprises the formation of a transistor, a capacitor and contacts to external circuits.

It is advantageous to form integrated circuits with smaller individual elements so that as many elements as possible may be formed in a single chip. In this way, electronic equipment becomes smaller and more reliable, assembly and packaging costs are minimized and circuit performance is improved. The capacitor is usually the largest element of a DRAM. Consequently, the development of smaller DRAMs focuses in large part on the capacitor. Three basic types of capacitors are used in DRAMs—planar capacitors, trench capacitors and stacked capacitors. Most large capacity DRAMs use stacked capacitors because of their greater capacitance, reliability and ease of formation. For stacked capacitors, the side of the capacitor connected to the transistor is commonly referred to as the "storage node" or "storage poly" and the side of the capacitor connected to the reference voltage is called the "cell poly."

The areas in a DRAM to which electrical connections are made are generally referred to as active areas. Active areas, which serve as source and drain regions for transistors, consist of discrete specially doped regions in the surface of the silicon substrate. As the size of the DRAM is reduced, the size of the active areas and the corridors available for contacts to reach the active areas are also reduced. The bit line contacts are typically formed between adjacent capacitor structures. Therefore, the chances for leakage or short circuits between the bit line contacts and the capacitor components increases as the cell spacing, and corresponding space available for the bit line contact, decreases. It is desirable to effectively isolate the bit line contacts from the capacitor components while optimizing the space available to make the contacts. The present invention addresses some of the problems associated with forming a contact corridor, typically for the contact between a bit line and an active area in the substrate, and properly aligning this contact corridor with, and isolating it from, adjacent capacitor components.

SUMMARY OF THE INVENTION

One object of the invention is to increase the alignment tolerances between capacitor components and an adjacent contact corridor in Dynamic Random Access Memories (DRAMs).

Another object is to effectively isolate capacitor components from adjacent contacts and thereby minimize current leakage and short circuits within the DRAM memory cell.

These and other objects and advantages are attained by an etch process wherein the horizontal region of cell poly adjacent to the capacitor structure is etched away to enlarge the area available for locating the contact corridor. According to one aspect of the invention, a capacitor structure is formed over a semiconductor substrate. The capacitor structure includes a first conductor, a dielectric layer on the first conductor and a second conductor on the dielectric layer. The second conductor has a horizontal region laterally adjacent to and extending away from the first conductor. The etch process comprises the steps of: (a) forming a layer of patterned photoresist over the second conductor, the photoresist being patterned to expose a portion of the horizontal region of the second conductor at a desired location of a contact corridor above a source/drain region in the substrate; (b) using the photoresist as an etch mask, anisotropically etching away the exposed portions of the horizontal region of the second conductor; and (c) using the photoresist again as an etch mask, isotropically etching away substantially all of the remaining portions of the horizontal region of the second conductor and thereby enlarging the area available for locating the contact corridor. Alternatively, a single isotropic etch is used instead to remove substantially all of the horizontal of the second conductor.

In another aspect of the invention, a plurality of spaced apart capacitor structures are formed over a semiconductor substrate. Each capacitor structure includes a first conductor, a dielectric layer on the first conductor and a second conductor on the dielectric layer. The second conductor has a horizontal region extending between adjacent capacitor structures. A layer of patterned photoresist is formed over the second conductor. The photoresist is patterned to expose a portion of the horizontal region of the second conductor at a desired location of a contact corridor above a source/drain region in the substrate. Using the photoresist as an etch mask, the exposed portions of the horizontal region of the second conductor are etched away. Then, again using the photoresist as an etch mask, substantially all of the remaining portions of the horizontal region of the second conductor are etched away.

The process of the invention, using either a one or two step etch to remove the horizontal region of cell poly, enlarges the area available for locating a contact corridor adjacent to the capacitor structure and thereby increases the alignment tolerances for the contact corridor etch and, correspondingly, minimizes the risk of current leakage or short circuits between the capacitor components and the adjacent contact. Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

The figures are not meant to be actual views of a DRAM, but are merely idealized representations used to depict the process of the invention.

DETAILED DESCRIPTION OF THE PREFERRED EMBODIMENTS

The present invention will be described in terms of Complementary Metal Oxide Semiconductor (CMOS) technology which is a commonly used integrated circuit technology. The invention, however, may be used in other integrated circuit technologies. CMOS integrated circuits are typically formed with a lightly doped P-type silicon substrate or a lightly doped N-type silicon substrate. The present invention will be described using lightly doped P-type silicon as the starting material, although the invention may be implemented with other substrate materials. If other substrate materials are used, then there may be corresponding differences in materials and structure of the device as is well known in the art.

The fabrication of semiconductor devices includes etching predetermined patterns into various layers of material formed during fabrication of the device. This process is sometimes referred to herein for convenience as "patterning and etching." Photolithography and reactive ion etching, for example, are commonly used pattern and etch processes. These or other pattern and etch processes, well known to those skilled in the art, may be used to implement the present invention.

Figure 1:
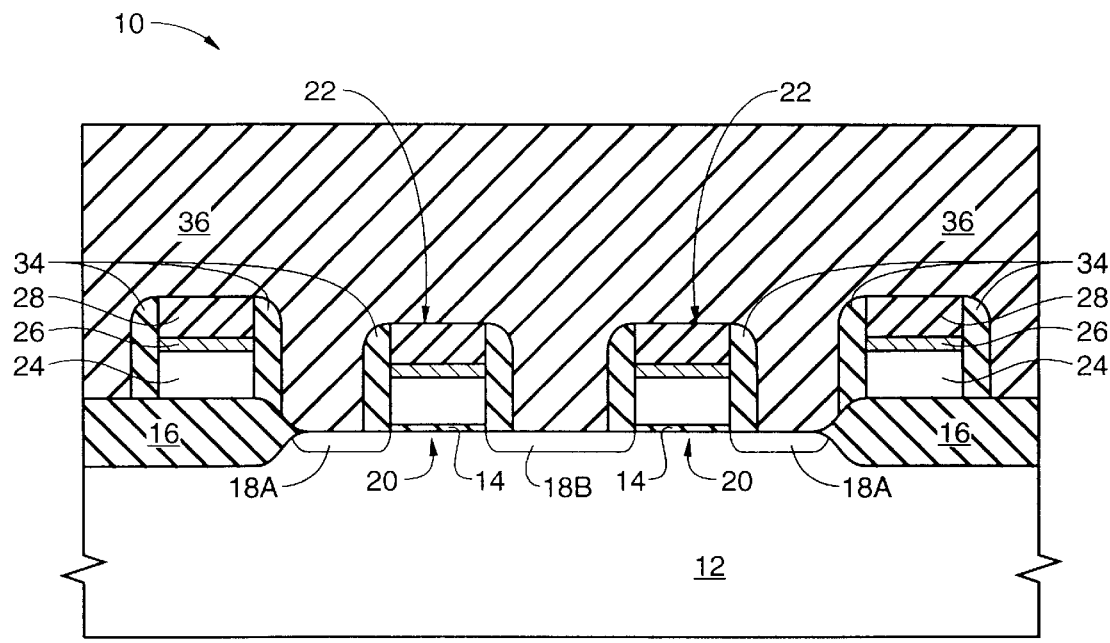
FIGS. 1–8, 10 and 11 are cross-section views of a portion of a DRAM stacked capacitor container cell at various stages of formation illustrating the structure formed according to the preferred embodiment of the invention, wherein the container walls are removed from the outer periphery of the storage nodes.

Referring to FIG. 1, wafer 10 comprises a lightly doped P-type single crystal silicon substrate 12 which has been oxidized to form thin gate insulating layer 14 and thick field oxide regions 16. Impurities are implanted in the surface of substrate 12 to form N+ doped source/drain regions 18a and 18b for access transistors 20. Transistor gate electrodes 22 are formed by successively depositing or "stacking" layers of polysilicon 24, tungsten silicide layer 26 and silicon dioxide 28 over substrate 12, and then patterning and etching those layers to expose substrate 12 at desired locations of the source/drain regions 18a and 18b. These layers are deposited, patterned and etched using conventional methods well known in the art. Alternatively, transistor gate electrodes 22 may be formed of a single layer of polysilicon deposited and etched as described above. The tungsten silicide and silicon dioxide layers are included herein merely to better illustrate the details of one of the preferred embodiments of the invention. Insulating spacers 34 are formed on either sides of transistor gate electrodes 22. Lower insulating layer 36, made of boro-phospho-silicate glass (BPSG), is then stacked over substrate 12. If necessary, lower insulating layer 36 is planarized, typically using a Chemical Mechanical Polishing (CMP) process, to facilitate further processing.

In the above and following discussion, some well-known aspects of DRAM fabrication have been simplified. For example, the structure of the doped source/drain regions generally will be more complex than shown. In addition, the particular materials, structures and processes are intended only to illustrate the invention so that it can be fully understood. Other materials, structures and processes may, in some instances, be substituted for the particular ones described. For example, silicon nitride may be used instead of silicon dioxide for insulating protective layer 28 and spacers 34. Spin-On Glass (SOG), Polyamide Insulator (PI), Chemical Vapor Deposited (CVD) oxide or other insulators may be used in place of the BPSG for lower insulator 36. Other satisfactory materials may be substituted for any of the above. Or, additional materials, structures and processes may also be added to those disclosed.

Figure 2:
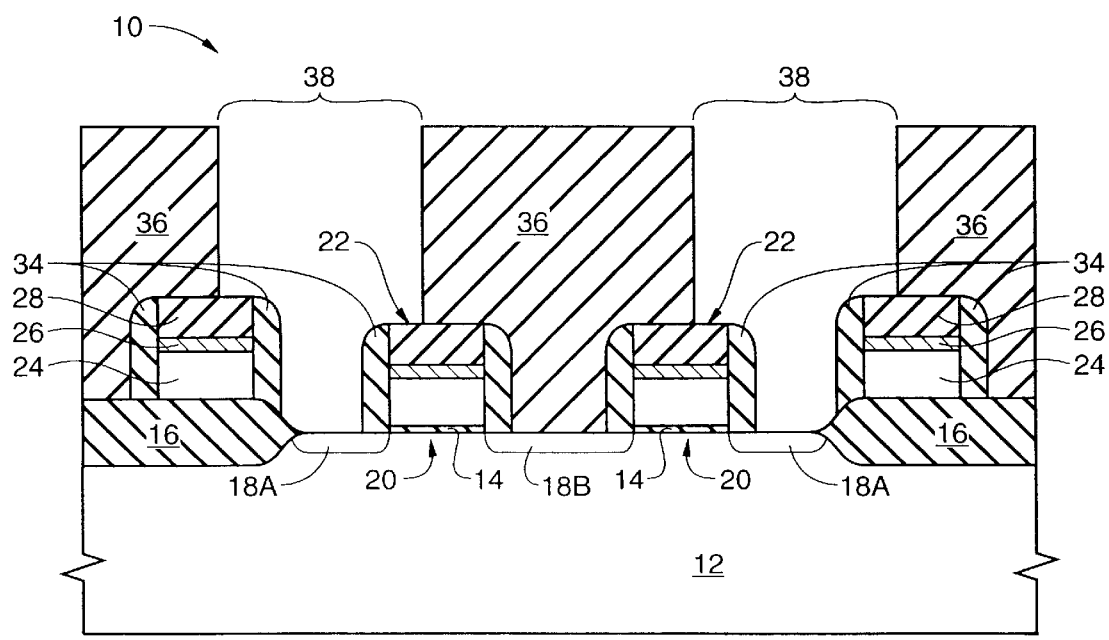
Figure 3:
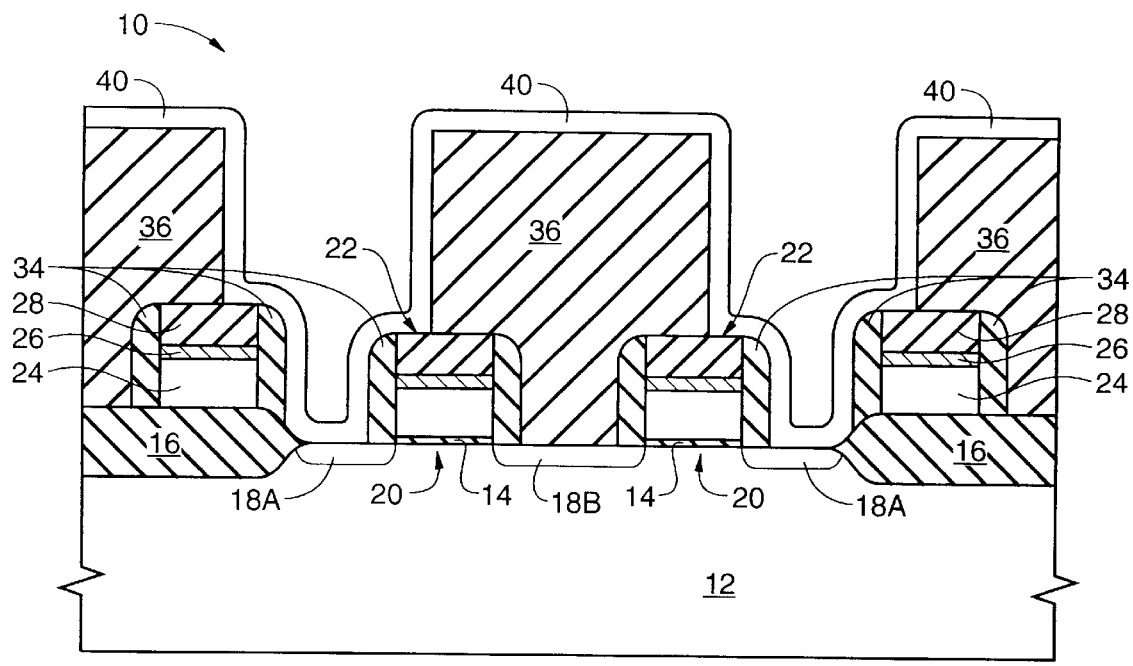
Figure 4:
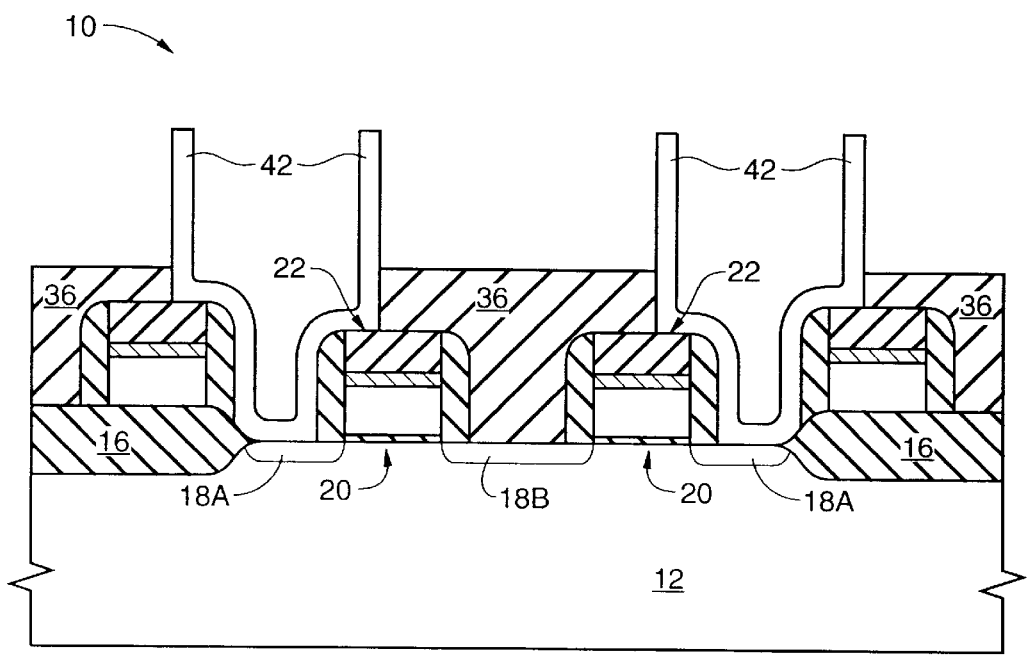

Referring to FIG. 2, lower insulating layer 36 is patterned and etched to define capacitor containers 38 and to expose portions of substrate 12 at source/drain regions 18a. Referring to FIGS. 3 and 4, storage poly 40 is deposited in containers 38 and on lower insulating layer 36. Storage poly 40 is preferably made of doped insitu rough textured polysilicon. Storage poly 40 is then patterned and etched or subjected to Chemical Mechanical Polishing (CMP) to form the capacitor first conductors 42, also sometimes referred to herein as the capacitor "storage nodes." Lower insulating layer 36 is partially removed with an oxide etch that is selective to poly so as not to etch the exposed storage nodes. This oxide etch exposes much of the outer peripheries of the storage nodes 42, as shown in FIG. 4, and significantly increases the capacitance area of the cell.

Figure 5A:
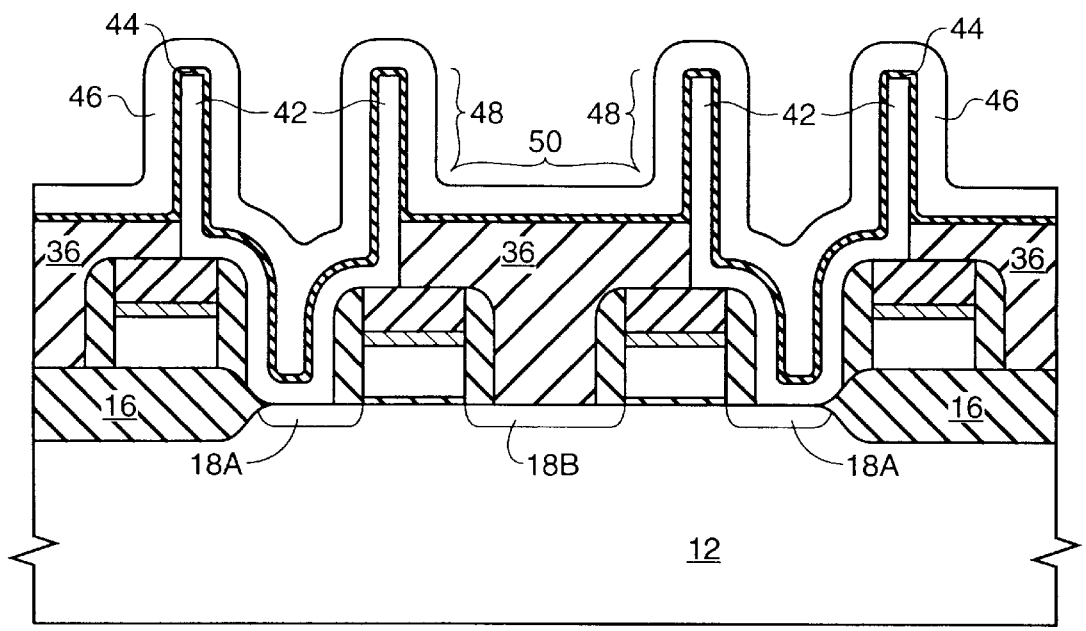

Referring to FIG. 5A, capacitor dielectric 44 is deposited over the structure previously formed. Capacitor dielectric 44 is made of silicon nitride or other suitable material. Cell poly 46, preferably made of doped insitu polysilicon, is then deposited on dielectric 44. Cell poly 46 is also sometimes referred to herein as the capacitor second conductor. A contact corridor will subsequently be formed in the area between the vertical regions 48 of cell poly 46. Cell poly 46 is deposited so that it bridges between adjoining storage nodes 42 as shown on the far left and right portions of FIG. 4 and as illustrated in FIG. 8. Bridging is not necessary but it is preferred because it makes the process more robust. That is, bridging helps protect the inter-node areas during etching of the bit line contact corridor.

The area in which the contact corridor will be located is formed by clearing the horizontal region 50 of cell poly 46. This area is preferably made as large as possible to allow for greater alignment tolerances in the contact corridor etch and, thereby, reduce the risk of short circuits or leakage between the contact and the capacitor components. Hence, it is desirable to remove all of the horizontal region 50 of cell poly 46 between the storage nodes 42. Due to limitations in photolithographic masking techniques, however, it is difficult to precisely align the photoresist etch mask with the edge of the vertical regions 48 of cell poly 46. To overcome this limitation, the horizontal region 50 of cell poly 46 is cleared using the resist undercut etch processes described below.

Figure 6:
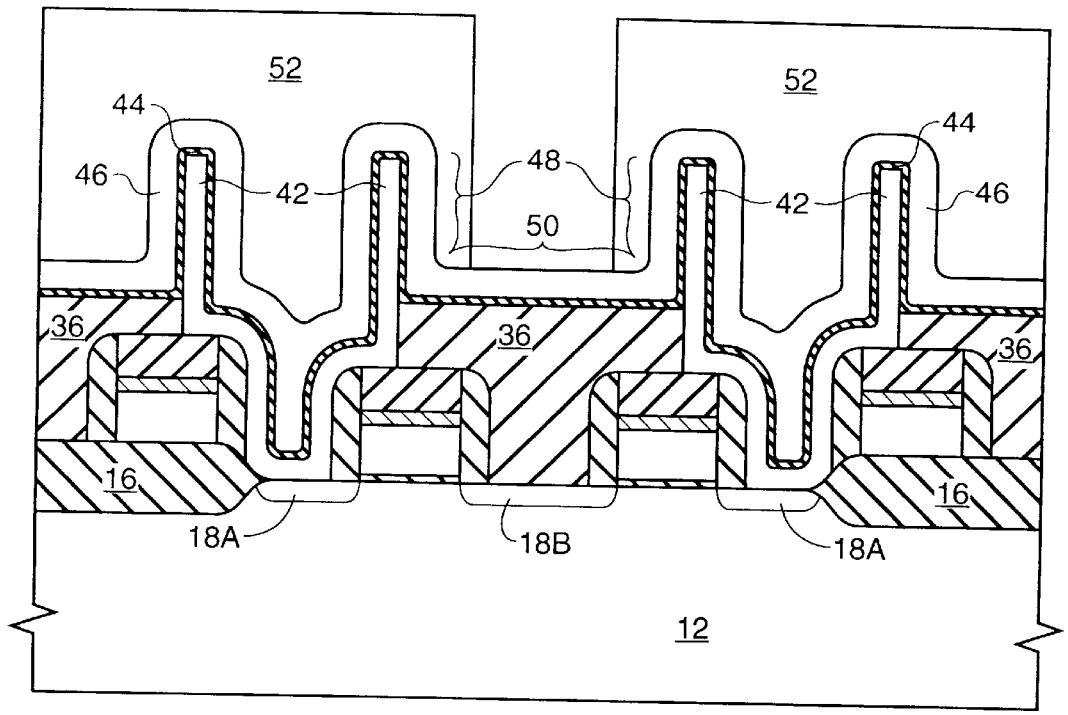
Figure 7:
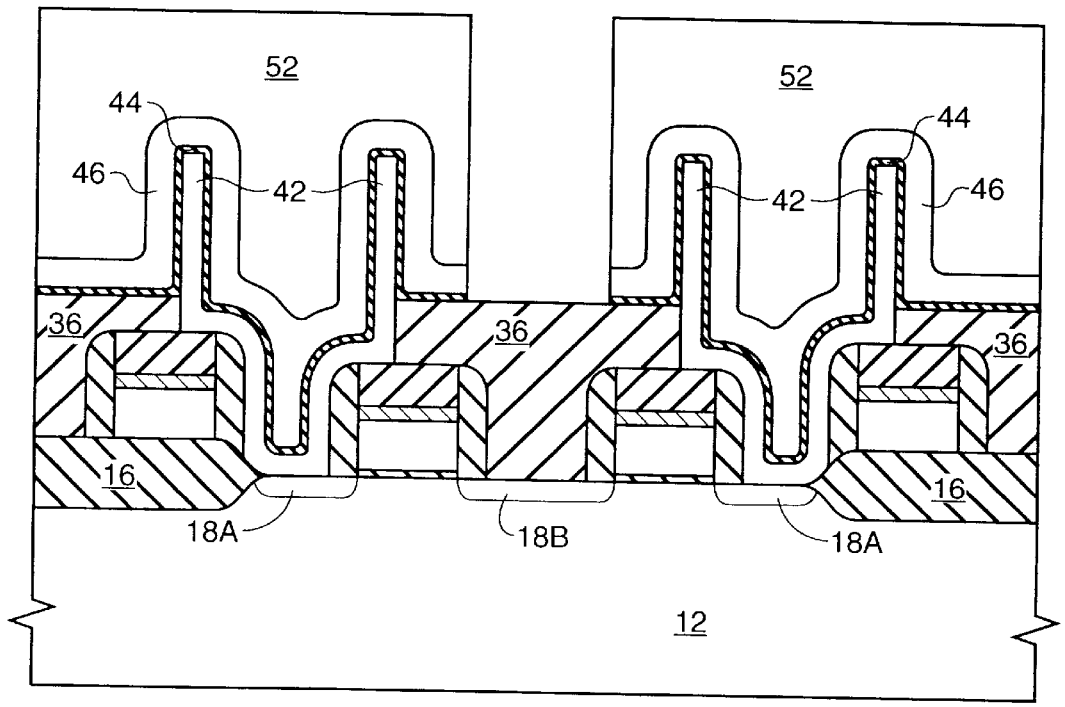
Figure 8A:
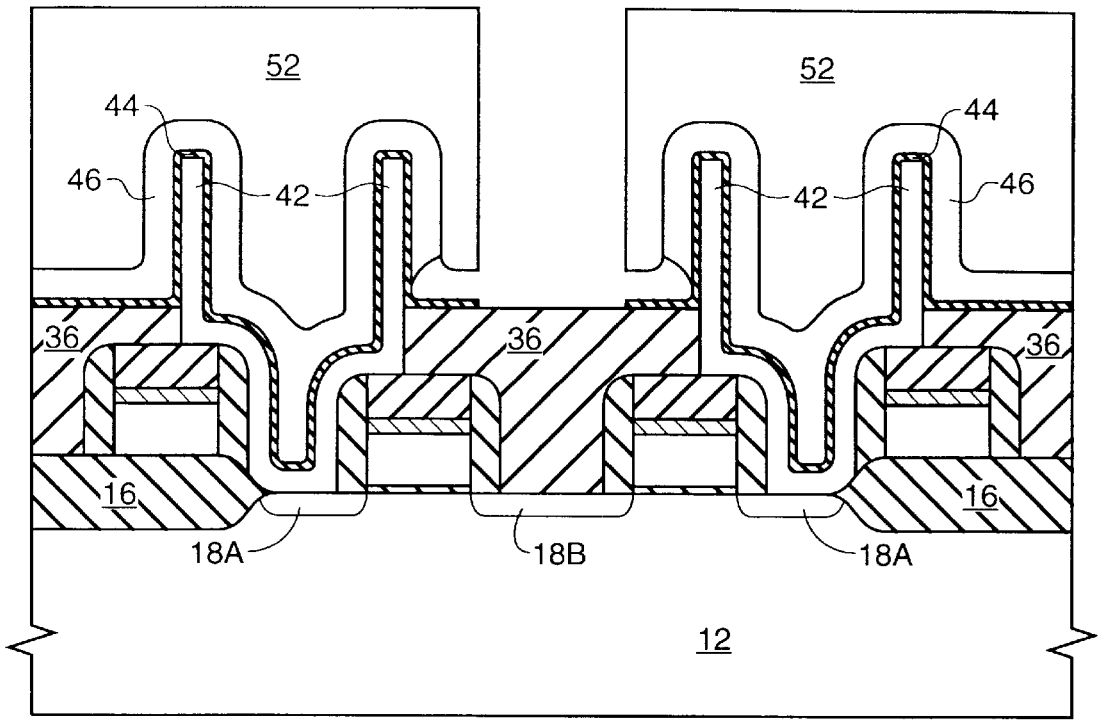

Referring to FIG. 6, a layer of photoresist 52 is formed and patterned to expose as much of the horizontal region 50 of cell poly 46 as possible without also exposing the vertical regions 48. Alternatively, a hard mask could be used in place of photoresist layer 52, as described in co-pending application Ser. No. 08/336,426, by Figura et al. filed on Nov. 11, 1994, titled METHOD OF MAKING A SELF-ALIGNED BIT LINE CONTACT FOR STACKED CAPACITOR DYNAMIC RANDOM ACCESS MEMORY DEVICES, incorporated herein by reference. Preferably, horizontal region 50 of cell poly 46 is cleared in two etch steps. First, the cell poly exposed through the photoresist layer is anisotropically etched, and this etch may continue down through capacitor dielectric 44 stopping on lower insulating layer 36, resulting in the structure shown on FIG. 7. Then, using an isotropic etch, the cell poly is etched horizontally back under the layer of photoresist to the edge of the vertical regions 48 of cell poly 46. Alternatively, the cell poly may be removed back to the edge of the vertical regions 48 using a single isotropic etch. The isotropic cell poly etch is, preferably, selective to the dielectric material to help ensure that capacitor dielectric 44 remains intact over storage node 42. The cell poly may be overetched, if necessary, so that substantially all of the horizontal region 50 of cell poly 46 is removed. The resulting structure is illustrated in FIG. 8A.

Figure 5B:
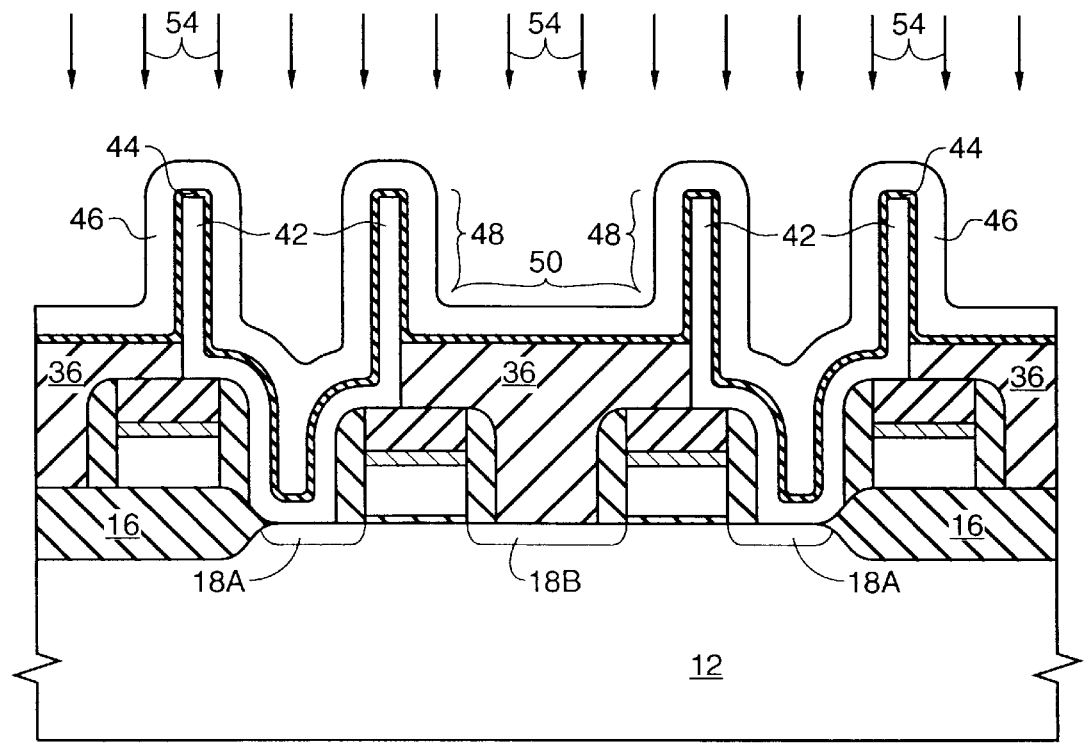
Figure 8B:
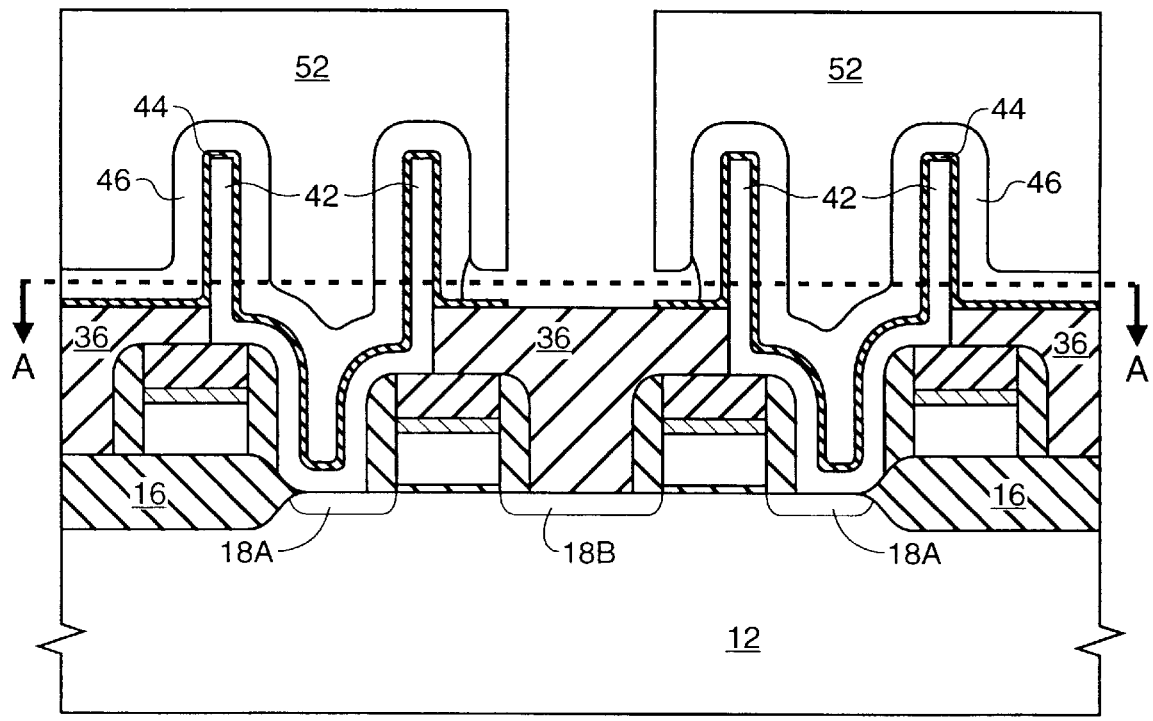
Figure 9:
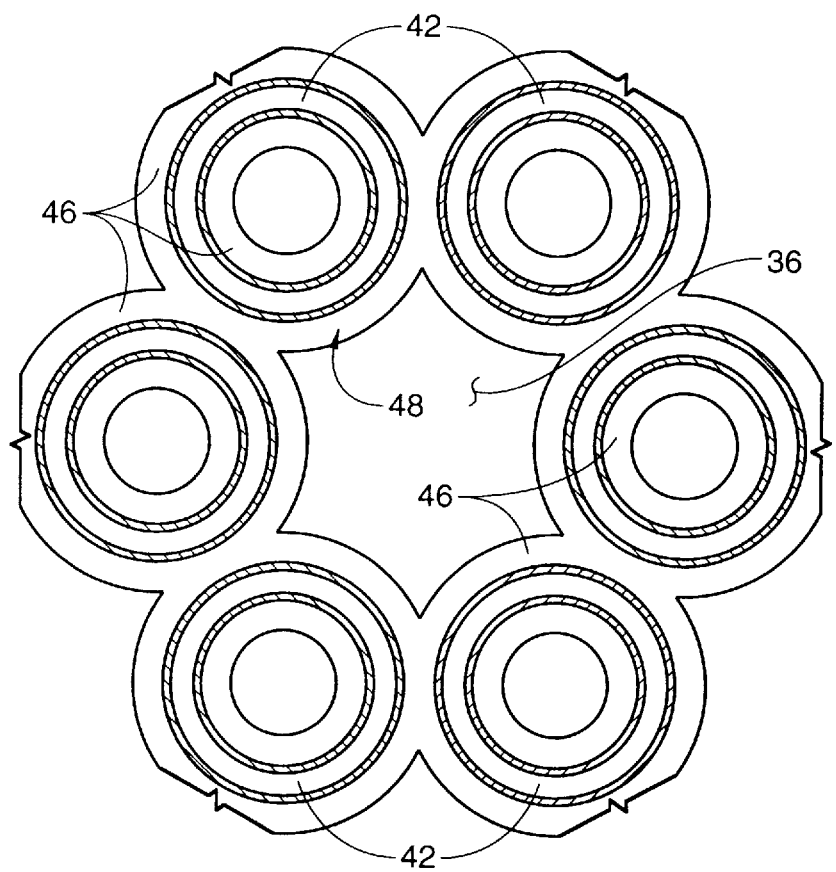
FIG. 9 is a top down cross-section view taken along the line A-A' of FIG. 8B.

To further minimize the risk that overetching will expose the cell dielectric, the horizontal region 50 of cell poly 46 may be doped prior to etching. Referring to FIG. 5B, impurities are implanted into the horizontal region 50 of the cell poly 46 as shown symbolically by arrows 54. The impurities are implanted at an angle of 0°, that is, vertically downward, so that only the horizontal regions of the cell poly are doped. The impurities are implanted at relatively high doses, e.g. about $10^{14}$–$10^{16}$ ions per square centimeter, to amorphize and damage the poly, but at low energy levels, e.g. 30–200 KeV, so that all ions remain in the cell poly. The heavily doped horizontal region 50 of cell poly 46 etches more rapidly than the undoped vertical regions 48. As illustrated in FIG. 8B, the undoped vertical regions 48 of cell poly 46 along the storage nodes 42 will effectively serve as an etch stop during overetching of the doped horizontal region 50. A top down view of the resulting structure, taken along the line A-A' in FIG. 8B, is shown on FIG. 9. In this way, the area available for the contact corridor is made as large as possible without uncovering the vertical portion of capacitor dielectric layer 44, thereby minimizing the need for reoxidation of capacitor dielectric layer 44.

Figure 10:
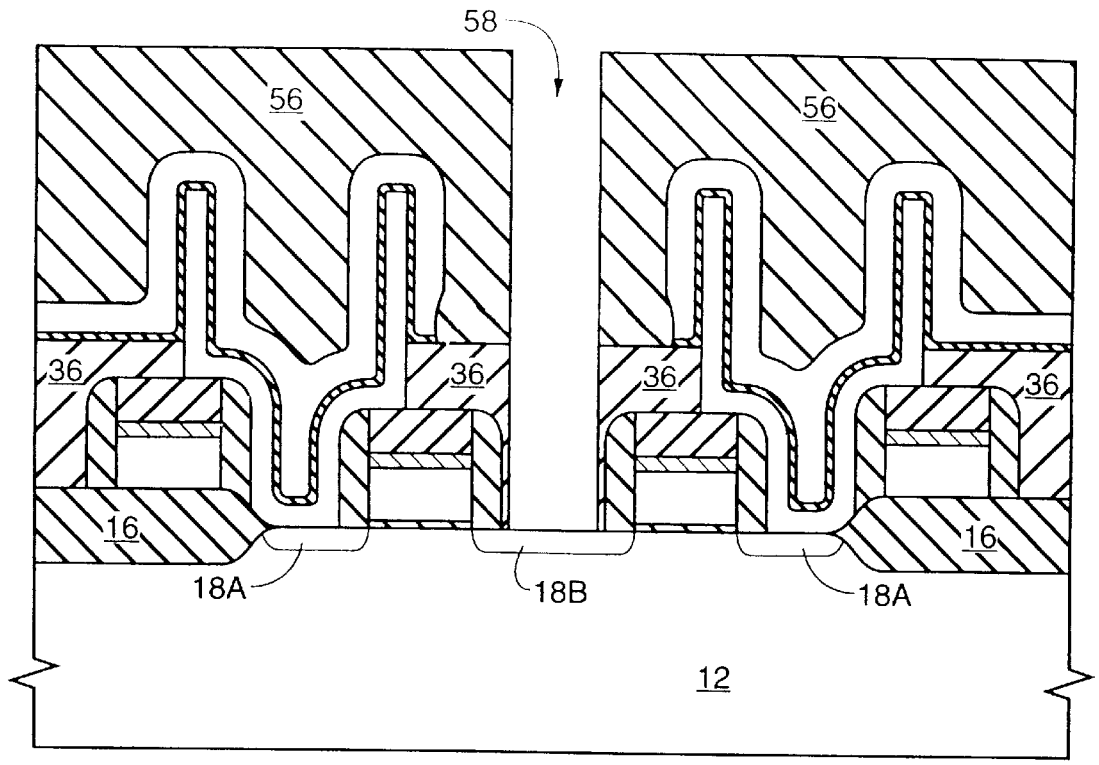
Figure 11:
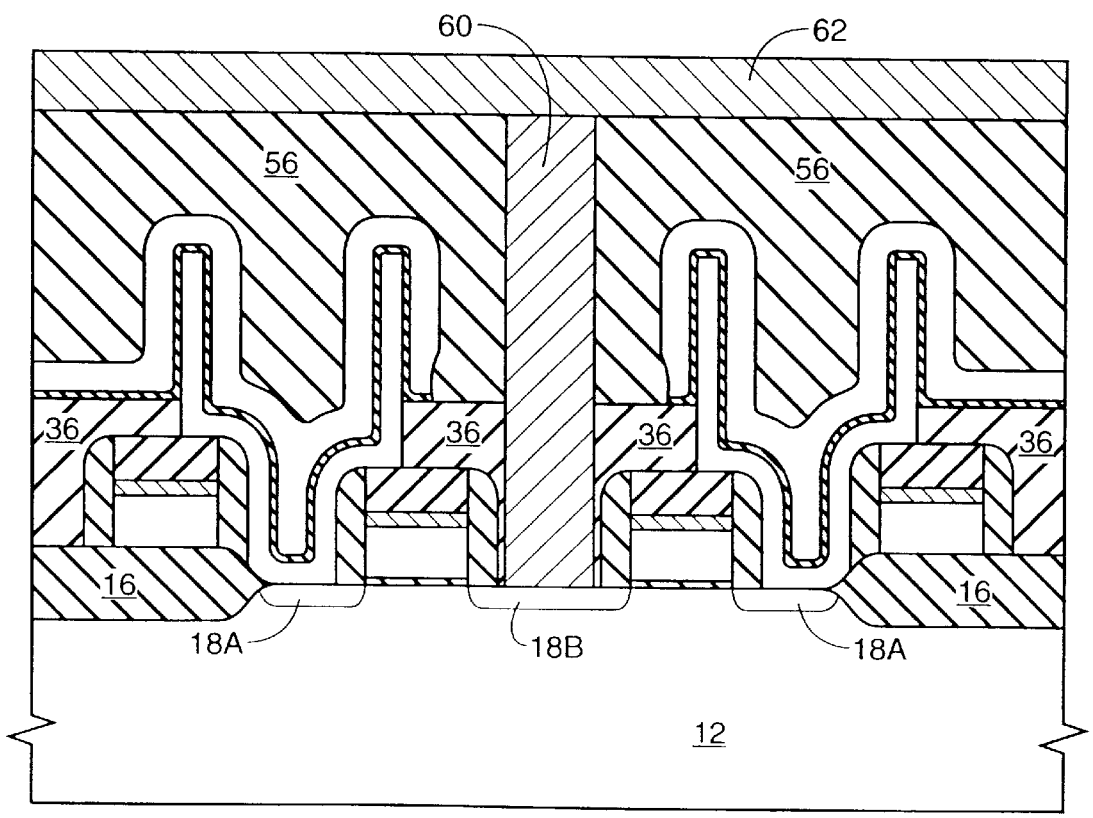

Using these etch processes, the alignment tolerances for the subsequent contact corridor etch are improved. Where, as here, the entire area between adjacent capacitor structures is cleared of cell poly, the contact corridor can be accurately patterned using photolithography. Consequently, no additional "self-aligning" structures are required. Referring to FIGS. 10 and 11, a thick upper insulating layer 56 of BPSG or other suitable insulating material is formed over the exposed upper surfaces of the structure previously formed. Preferably, upper insulating layer 56 is planarized using CMP or other suitable processes to facilitate subsequent etching. Upper insulating layer 56 is patterned and etched to form contact corridor 58. A bit line contact will typically be formed in the contact corridor 58 adjacent to the capacitor structure. It is to be understood, however, that the present invention may be used to clear an area for any contact corridor in which a contact will be formed adjacent to, and electrically isolated from, the capacitor components. Bit line contact 60 and bit line 62 are then formed using metal deposition techniques well known in the art.

An alternative embodiment of the invention will now be described with reference to FIGS. 12–20. In this embodiment, the storage nodes are surrounded by the sidewalls of the capacitor container. Also, a double wall crown cell capacitor structure and bit line contact are formed over polysilicon plugs which electrically connect these components to source/drain regions in the substrate. For convenience, the reference numerals for those components common to both embodiments are the same as those used to describe the embodiment illustrated in FIGS. 1–11. The materials and processes used to form the components shown in FIGS. 12–20 are essentially the same as those used for the preferred embodiment described above.

Figure 12:
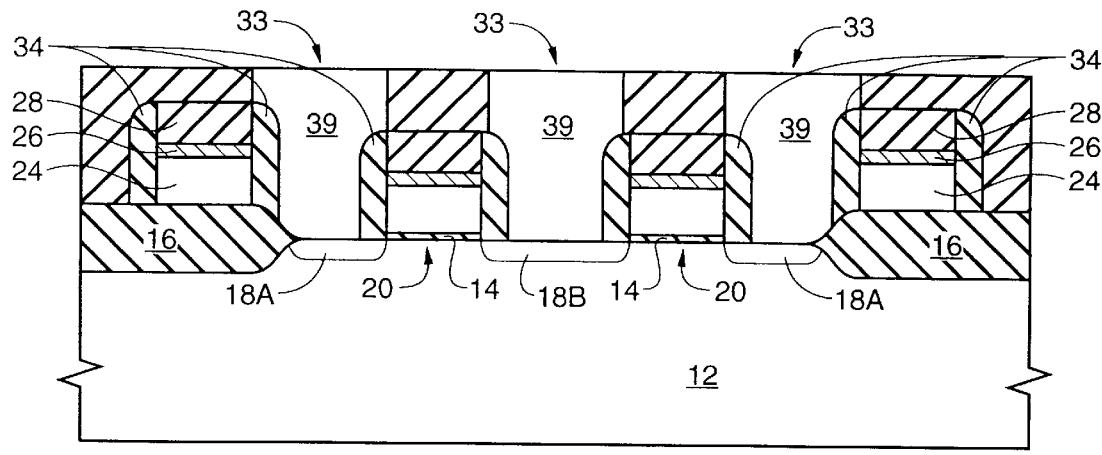
FIGS. 12–20 are cross-section views of a portion of a DRAM stacked capacitor container cell at various stages of formation illustrating the structure formed according to an alternative embodiment of the invention, wherein the storage nodes are surrounded by the container walls.

Referring to FIG. 12, the access transistors 20, source/drain regions 18a and 18b, spacers 34 and lower insulating layer 36 are formed according to the process steps set forth above with reference to FIG. 1. Lower insulating layer 36 is then patterned and etched to define openings 33 and to expose substrate 12 at source/drain regions 18a and 18b within openings 33. Openings 33 are filled with doped polysilicon to form plugs 39. Plugs 39 electrically connect source/drain regions 18a and 18b to capacitor storage nodes 42 and bit line contact 34, respectively (shown in FIG. 20). Plugs 39 are planarized as necessary to provide a flat surface for the subsequent deposition of the storage poly.

Figure 13:
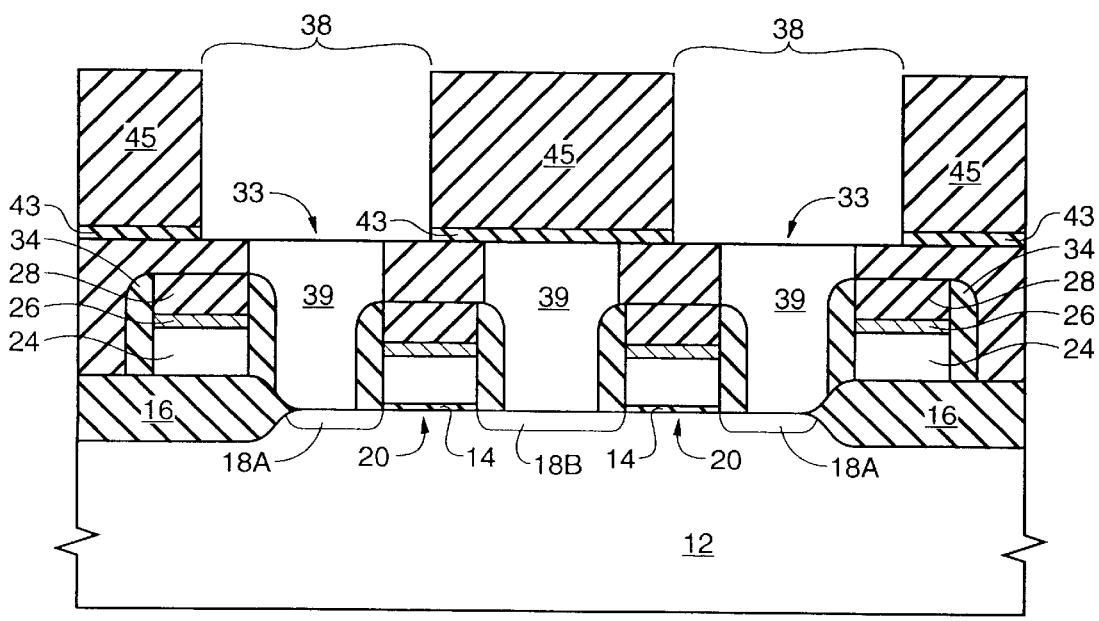
Figure 14:
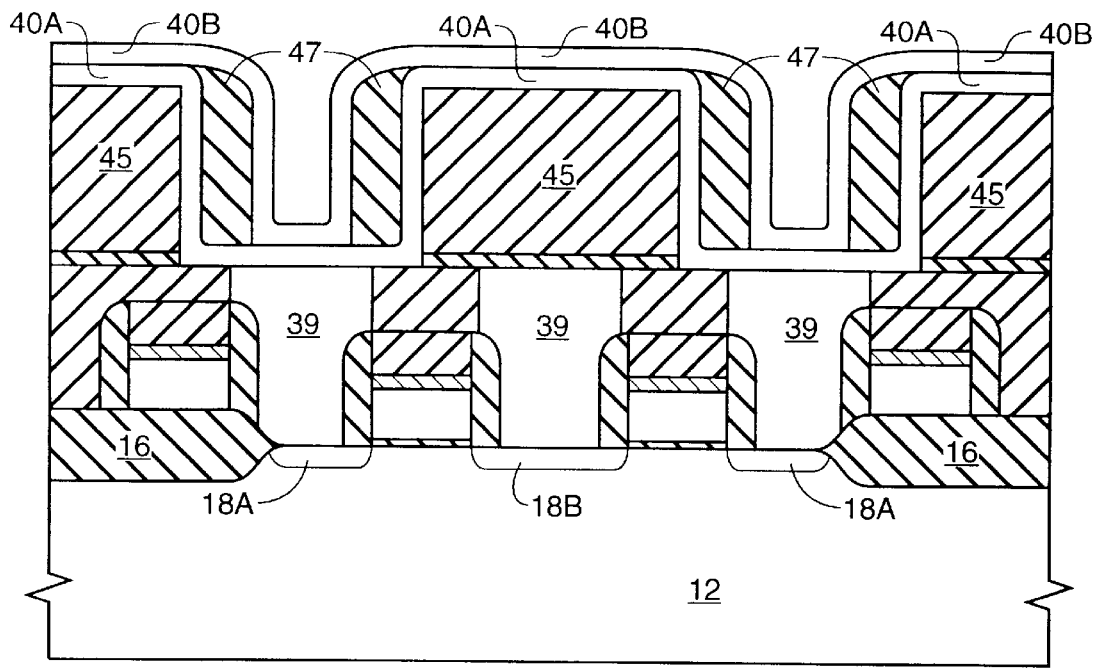
Figure 15:
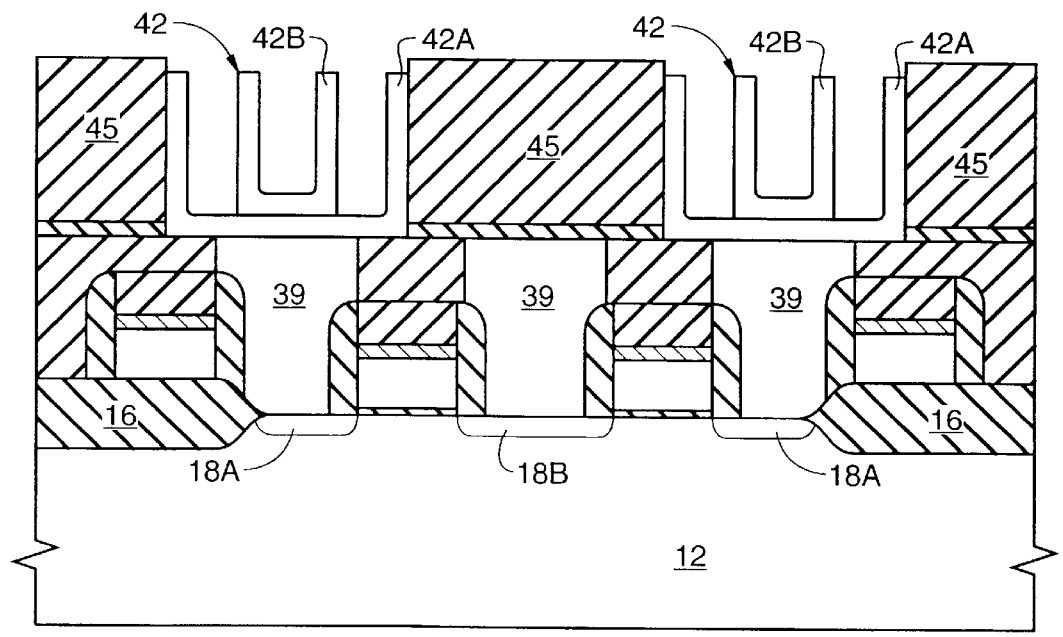

Referring to FIG. 13, etch stop layer 43, made of silicon nitride or other suitable material, is deposited over the structure previously formed. Intermediate insulating layer 45 is deposited over etch stop layer 43. Intermediate insulating layer 45 is patterned and etched with the etch continuing down through etch stop layer 43 to define capacitor container 38. Referring to FIG. 14, a first layer of doped polysilicon, referred to herein as first storage poly 40a, is deposited over the structure previously formed. Second insulating spacers 47, typically made of silicon dioxide, are formed on first storage poly 40a along the sidewalls of capacitor container 38. Then, a second layer of doped polysilicon, referred to herein as second storage poly 40b, is deposited over the structure previously formed. Second storage poly 40b is patterned and etched, and this etch continues down through first storage poly 40a, to form capacitor first conductors 42, also referred to herein as the capacitor storage nodes. Each storage node 42 comprises an outer wall 42a and an inner wall 42b. The storage poly etch preferably continues down to remove first and second storage poly 40a and 40b to a level slightly below the top surface of capacitor container 38. Recessing the storage nodes below the top of container 38 helps protect the dielectric during the cell poly etch steps described below. The storage poly etch is followed by an oxide etch to remove second insulating spacers 47, resulting in the structure shown in FIG. 15.

Figure 16:
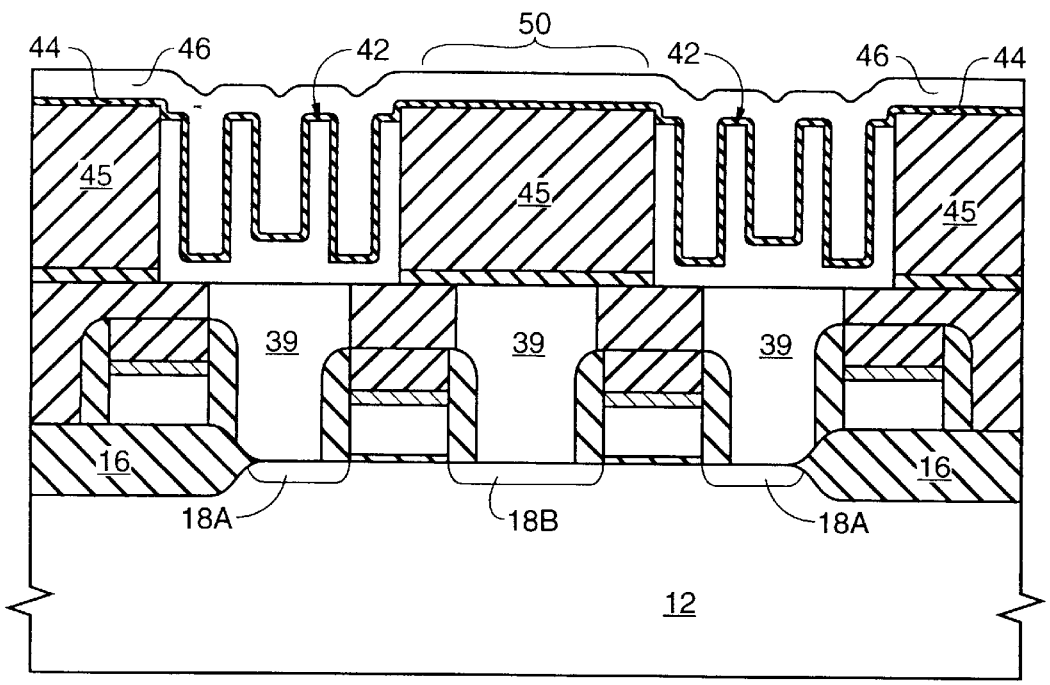

Referring to FIG. 16, capacitor dielectric 44 is deposited over the structure previously formed. Cell poly 46 is then deposited on dielectric 44. Cell poly 46 is also referred to herein as the capacitor second conductor. A bit line contact corridor will subsequently be formed in the area between the storage nodes. The bit line contact area is formed by clearing the horizontal region 50 of cell poly 46. The bit line contact area should be made as large as possible to allow for greater alignment tolerances in the bit line contact corridor etch and, thereby, reduce the risk of short circuits or leakage between the bit line contact and the capacitor components. Hence, it is desirable to remove all of the horizontal region 50 of cell poly 46 between the storage nodes 42.

Figure 17:
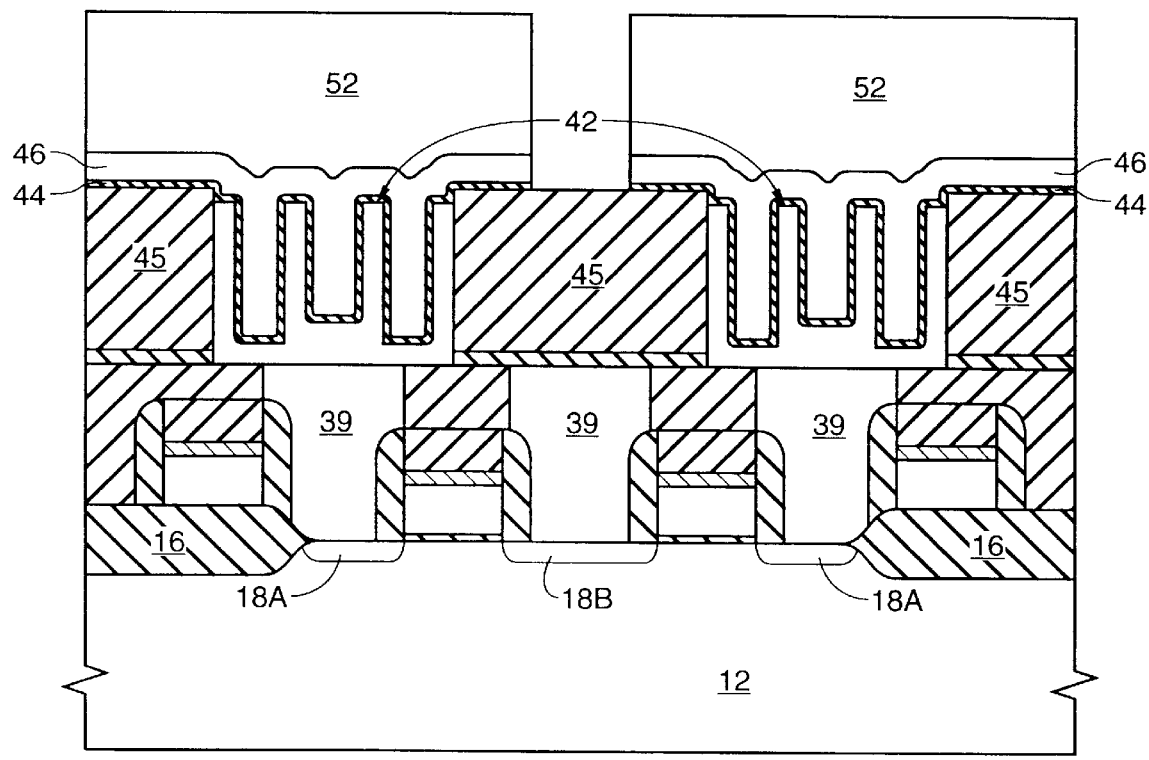
Figure 18:
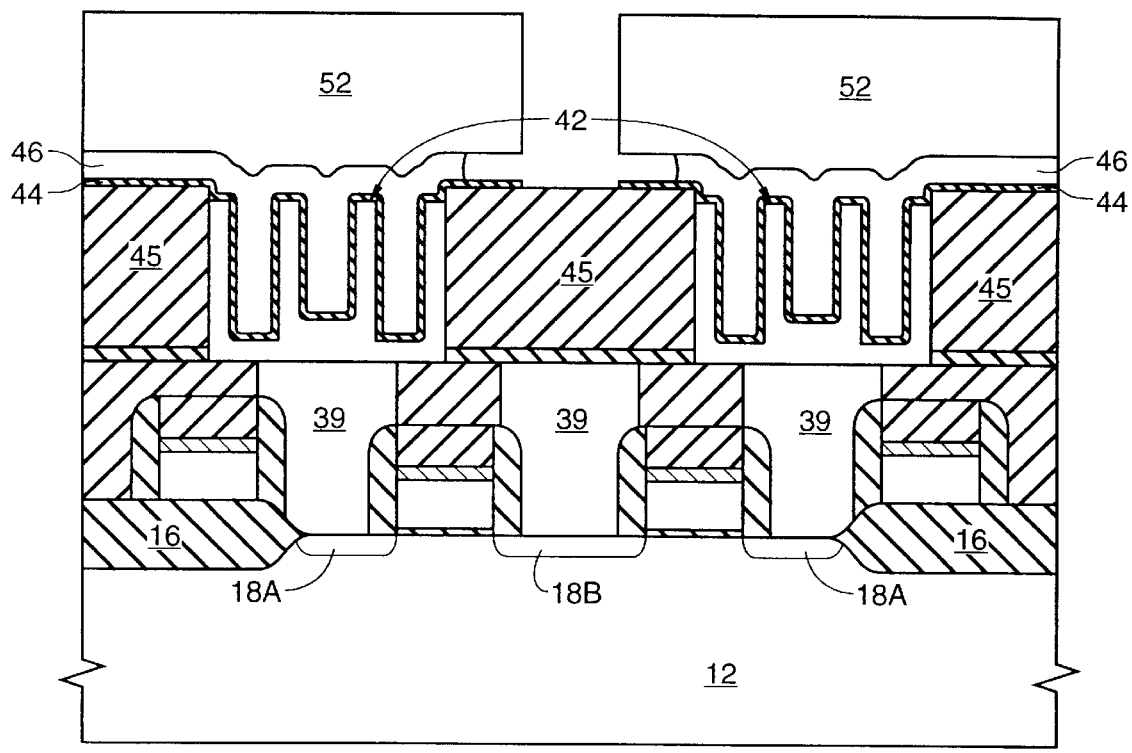

Referring to FIG. 17, a layer of photoresist 52 is formed and patterned to expose as much of the horizontal region 50 of cell poly 46 as possible without also exposing the capacitor container 38. Horizontal region 50 of cell poly 46 is, preferably, cleared in two etch steps. First, the cell poly exposed through the photoresist layer is anisotropically etched, and this etch may continue down through capacitor dielectric 44 stopping on intermediate insulating layer 38, resulting in the structure shown on FIG. 17. Then, using an isotropic etch, the cell poly is etched horizontally back under the layer of photoresist to the edge of the capacitor container 38 as shown in FIG. 18. Alternatively, the cell poly may be etched back to the edge of the capacitor container 38 using a single isotropic etch. The cell poly may be overetched, if necessary, so that substantially all of the horizontal region 50 of cell poly 46 is removed. Preferably, the isotropic cell poly etch is selective to the dielectric material to ensure that capacitor dielectric 44 remains intact over storage node 42. However, because the storage nodes 42 are recessed below the top surface of container 38, the selectivity of the cell poly etch is not critical as the container will help protect the dielectric during any overetching of the cell poly.

Figure 19:
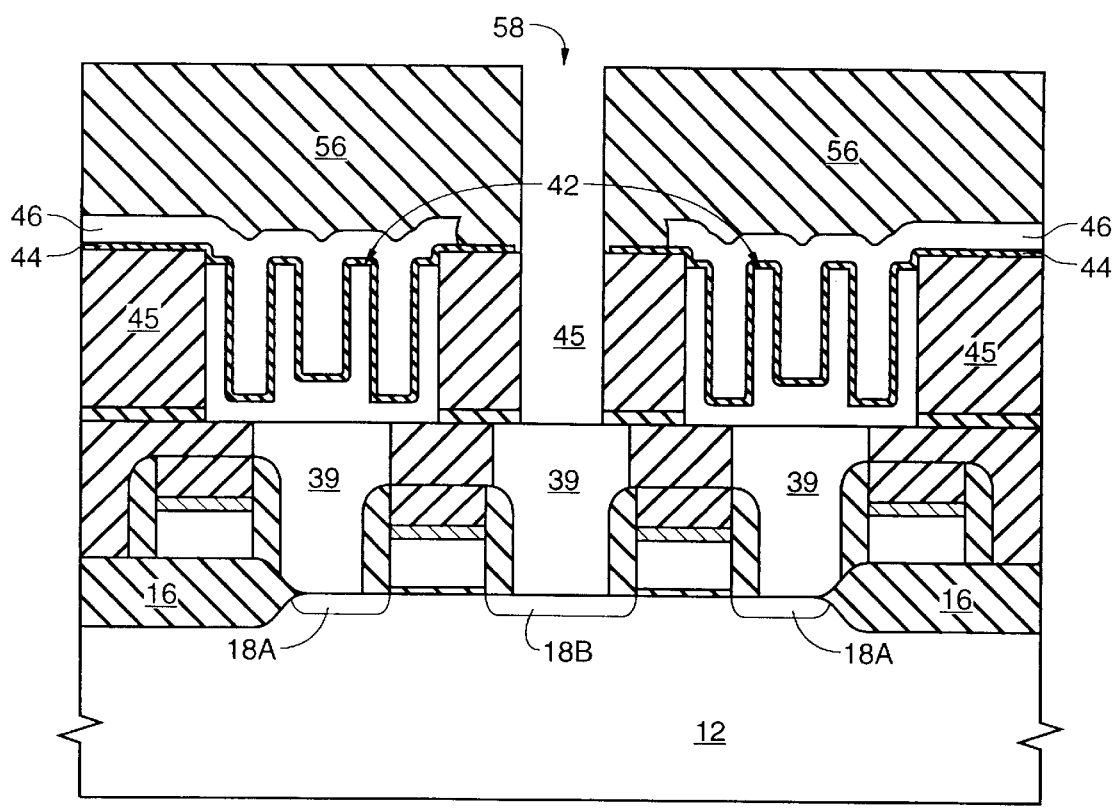
Figure 20:
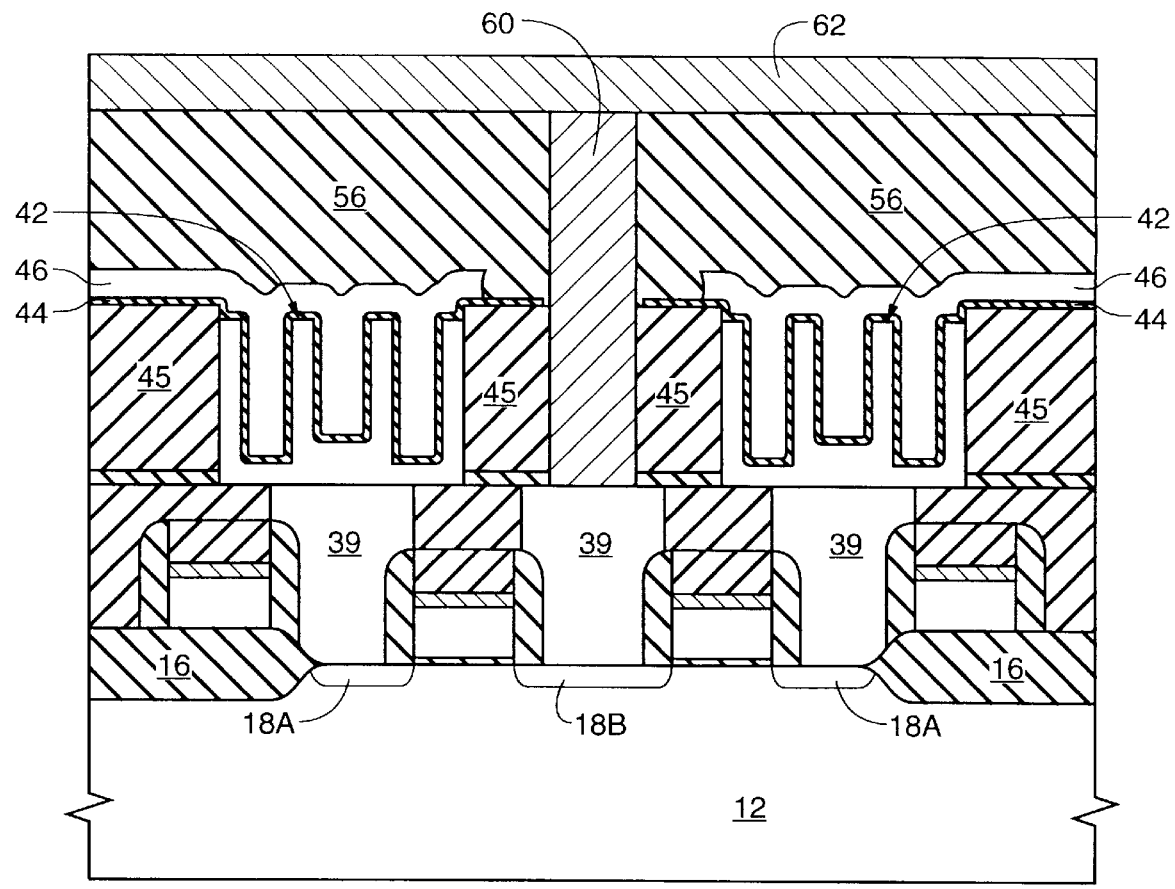

Referring to FIGS. 19 and 20, a thick upper insulating layer 56 of BPSG or other suitable insulating material is formed over the exposed upper surfaces of the structure previously formed. Preferably, upper insulating layer 56 is planarized using CMP or other suitable processes to facilitate subsequent etching. Upper insulating layer 56 is patterned and etched to form bit line contact corridor 58. Bit line contact 60 and bit line 62 are then formed using metal deposition techniques well known in the art.

There has been shown and described novel etch processes for aligning a capacitor structure and a bit line contact. The process can be utilized to fabricate more compact and better performing DRAMs. The particular embodiments shown in the drawings and described herein are for purposes of example and should not be construed to limit the invention as set forth in the appended claims. The process of the invention may be used in any stacked capacitor DRAM structure where a contact corridor is located adjacent to the capacitor. Those skilled in the art may now make numerous uses and modifications of the specific embodiments described without departing from the scope of the invention.

We claim:

1. An etch process for aligning a capacitor structure formed over a semiconductor substrate and an adjacent contact, the capacitor structure having a first conductor, a dielectric layer on the first conductor and a second conductor on the dielectric layer, the second conductor having a horizontal region laterally adjacent to and extending away from the first conductor, the etch process comprising the steps of:
   a. forming a layer of patterned photoresist over the second conductor, the photoresist being patterned to expose a portion of the horizontal region of the second conductor at a desired location of a contact corridor above a source/drain region in the substrate;
   b. using the photoresist as an etch mask, anisotropically etching away the exposed portions of the horizontal region of the second conductor; and
   c. using the photoresist as an etch mask, isotropically etching away substantially all remaining portions of the horizontal region of the second conductor.

2. An etch process according to claim 1, further comprising the step of implanting amorphizing ions into the horizontal region of the second conductor.

3. An etch process according to claim 1, further comprising the steps of:
   a. after step (c), forming an upper insulating layer over the structure previously formed in steps (a)–(c);
   b. etching through the upper insulating layer at the location of the contact corridor and continuing to etch down to form a contact corridor for making electrical contact to the source/drain region in the substrate; and
   c. forming a contact in the contact corridor, the contact being in electrical contact with the source/drain region and electrically isolated from the capacitor structure.

4. An etch process according to claim 2, wherein the ions are implanted vertically downward so that only the horizontal regions of the second conductor are doped.

5. An etch process according to claim 2, wherein the ions are implanted at an energy level in the range of 30 KeV to 200 KeV.

6. An etch process according to claim 2, wherein the ions are implanted at a dose in the range of $10^{14}$ to $10^{16}$ ions per square centimeter.

7. An etch process according to claim 3, wherein a bit line contact is formed in the contact corridor.

8. A process of making an integrated circuit device, comprising the steps of:
   a. providing a plurality of spaced apart capacitor structures over a semiconductor substrate, each capacitor structure comprising a first conductor, a dielectric layer on the first conductor and a second conductor on the dielectric layer, the second conductor having a horizontal region extending between adjacent capacitor structures;
   b. forming a layer of patterned photoresist over the second conductor, the photoresist being patterned to expose a portion of the horizontal region of the second conductor at a desired location of a contact corridor above a source/drain region in the substrate;
   c. using the photoresist as an etch mask, anisotropically etching away the exposed portions of the horizontal region of the second conductor; and
   d. using the photoresist as an etch mask, isotropically etching away substantially all remaining portions of the horizontal region of the conductor.

9. A process of making an integrated circuit device according to claim 8, wherein the first conductor includes a substantially vertical storage node, the second conductor includes a substantially vertical region conforming to the storage node with the dielectric layer interposed therebetween, and the horizontal region of the second conductor is etched back to the vertical region thereby enlarging the area available for locating the contact corridor.

10. A process of making an integrated circuit device according to claim 8, wherein:
   a. the first conductor includes at least one substantially vertical storage node disposed within a capacitor container, the capacitor container being characterized by vertical sidewalls formed in a layer of insulating material;
   b. the second conductor includes a substantially vertical region conforming to each storage node with the dielectric layer interposed therebetween, and the horizontal region of the second conductor extends along an upper surface of the insulating layer between adjacent capacitor containers; and
   c. the horizontal region of the second conductor is etched at least back to the sidewall of the capacitor container.

11. A process of making an integrated circuit device according to claim 8, further comprising the steps of:
   a. after step (d), forming an upper insulating layer over the structure previously formed in steps (a)–(d);

b. etching through the upper insulating layer at the location of the contact corridor and continuing to etch down to form a contact corridor for making electrical contact to the source/drain region in the substrate; and c. forming a contact in the contact corridor, the contact being in electrical contact with the source/drain region and electrically isolated from the capacitor structure.

12. A process of making an integrated circuit device according to claim 11, wherein a bit line contact is formed in the contact corridor.

13. A process of making an integrated circuit device, comprising the steps of:

a. providing an integrated circuit wafer having a semi-conducting substrate, a plurality of transistor gate members each comprising a gate insulating layer formed on the substrate and a gate conducting layer on said gate insulating layer, and first and second source/drain regions on the semiconducting substrate;

b. forming an lower insulating layer over the wafer;

c. patterning and etching the lower insulating layer to form a capacitor container, the capacitor container being characterized by substantially vertical sidewalls in the lower insulating layer;

d. forming a capacitor first conductor conforming to the vertical sidewalls of the container, the first conductor being in electrical contact with the first source/drain region;

e. forming a capacitor dielectric layer on and conforming to the capacitor first conductor;

f. forming a capacitor second conductor on the capacitor dielectric layer, the capacitor second conductor having a vertical region conforming to the capacitor first conductor with the dielectric layer interposed therebetween and a horizontal region adjacent to and extending away from the capacitor first conductor;

g. forming a layer of patterned photoresist over the second conductor, the photoresist being patterned to expose a portion of the horizontal region of the second conductor at a desired location of a contact corridor above the second source/drain region;

h. using the photoresist as an etch mask, anisotropically etching away the exposed portions of the horizontal region of the second conductor; and i. using the photoresist as an etch mask, isotropically etching away substantially all remaining portions of the horizontal region of the second conductor.

14. A process of making an integrated circuit device according to claim 13, further comprising the step of patterning and etching the lower insulating layer to remove at least a portion of the capacitor container sidewalls and thereby expose a substantially vertical outer surface of the capacitor first conducting layer and wherein the horizontal region of the second conductor is etched back to the vertical region of the second conductor thereby enlarging the area available for locating the contact corridor.

15. A process of making an integrated circuit device according to claim 13, wherein the horizontal region of the second conductor is etched at least back to the sidewall of the capacitor container thereby enlarging the area available for locating the contact corridor.

16. A process of making an integrated circuit device according to claim 13, further comprising the steps of:

a. after step (i), forming an upper insulating layer over the structure previously formed in steps (a)–(i);

b. etching through the upper insulating layer at the location of the contact corridor and continuing to etch down to form a contact corridor for making electrical contact to the source/drain region in the substrate; and c. forming a contact in the contact corridor, the contact being in electrical contact with the source/drain region and electrically isolated from the capacitor structure.

17. A process of making an integrated circuit device according to claim 16, wherein a bit line contact is formed in the contact corridor.

* * * * *